US012628424B2

(12) United States Patent
Lin et al.

(10) Patent No.: US 12,628,424 B2
(45) Date of Patent: May 12, 2026

(54) ELECTRONIC DEVICE AND REPAIR METHOD THEREOF

(71) Applicant: Innolux Corporation, Miaoli County (TW)

(72) Inventors: Jia-Sin Lin, Miaoli County (TW); Yi-Hung Lin, Miaoli County (TW); Yan-Zheng Wu, Miaoli County (TW); Chen-Lin Yeh, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 434 days.

(21) Appl. No.: 18/186,970

(22) Filed: Mar. 21, 2023

(65) Prior Publication Data

US 2023/0335508 A1 Oct. 19, 2023

Related U.S. Application Data

(60) Provisional application No. 63/331,883, filed on Apr. 18, 2022.

(30) Foreign Application Priority Data

Dec. 28, 2022 (CN) .......................... 202211697488.9

(51) Int. Cl.
*H10D 86/60* (2025.01)
*H10D 86/40* (2025.01)

(52) U.S. Cl.
CPC .......... *H10D 86/60* (2025.01); *H10D 86/411* (2025.01); *H10D 86/441* (2025.01)

(58) Field of Classification Search
CPC .... H10K 71/861; H10D 86/60; H10D 86/411; H10D 86/441
See application file for complete search history.

(56) References Cited

U.S. PATENT DOCUMENTS

| | | | |
|---|---|---|---|
| 2021/0050403 A1* | 2/2021 | Lee .................... | G06V 40/1318 |
| 2022/0013619 A1* | 1/2022 | Lee .................... | G09G 3/3233 |
| 2023/0200195 A1* | 6/2023 | Kim ..................... | H10K 59/38 |
| | | | 257/40 |

FOREIGN PATENT DOCUMENTS

| | | |
|---|---|---|
| CN | 105097867 | 11/2015 |
| CN | 111199998 | 5/2020 |
| CN | 113921565 | 1/2022 |

(Continued)

OTHER PUBLICATIONS

"Office Action of Taiwan Counterpart Application", issued on Apr. 8, 2025, p. 1-p. 12.

(Continued)

*Primary Examiner* — Mariceli Santiago
(74) *Attorney, Agent, or Firm* — JCIPRNET

(57) ABSTRACT

An electronic device and a repair method thereof are provided. The repair method of the electronic device includes: providing a panel, wherein the panel includes a substrate, a first conductive layer disposed on the substrate, a transistor disposed on the substrate, and a dielectric layer disposed between the first conductive layer and the transistor, wherein the transistor comprises a first electrode and a second electrode; and cutting at least one of the first electrode and the second electrode with a laser beam, wherein a cutting point formed by the laser beam does not overlap with the first conductive layer.

6 Claims, 13 Drawing Sheets

1

(56) References Cited

FOREIGN PATENT DOCUMENTS

| KR | 20200079740 A | * | 7/2020 | ........... H10K 71/861 |
| TW | 201725660 | | 7/2017 | |

OTHER PUBLICATIONS

"Office Action of Taiwan Counterpart Application", issued on Nov. 12, 2025, p. 1-p. 8.

* cited by examiner

ELECTRONIC DEVICE AND REPAIR METHOD THEREOF

CROSS-REFERENCE TO RELATED APPLICATION

This application claims the priority benefit of U.S. provisional application Ser. No. 63/331,883, filed on Apr. 18, 2022, and China application serial no. 202211697488.9, filed on Dec. 28, 2022. The entirety of each of the above-mentioned patent applications is hereby incorporated by reference herein and made a part of this specification.

BACKGROUND

Technical Field

The disclosure relates to an electronic device and a repair method thereof.

Description of Related Art

Defects in the element array are usually repaired by adopting a laser. However, when there are other conductive layers (for example, metal layers) between the element array and the substrate, the upper and lower conductive layers, which are originally electrically insulated, are prone to short circuit due to high temperature melting during the laser repair process.

SUMMARY

The disclosure provides an electronic device and a repair method thereof, which help to reduce short circuit caused by laser repair.

According to some embodiments of the disclosure, a repair method of an electronic device includes the following steps. A panel is provided. The panel includes a substrate, a first conductive layer disposed on the substrate, a transistor disposed on the substrate, and a dielectric layer disposed between the first conductive layer and the transistor. The transistor includes a first electrode and a second electrode. At least one of the first electrode and the second electrode is cut with a laser beam. A cutting point formed by the laser beam does not overlap with the first conductive layer.

According to some other embodiments of the disclosure, the electronic device includes a panel. The panel includes a substrate, a first conductive layer, a transistor, and a dielectric layer. The first conductive layer is disposed on the substrate and has an opening. The transistor is disposed on the substrate. The transistor includes a first electrode and a second electrode, and the transistor at least partially overlaps with the opening. The dielectric layer is disposed between the first conductive layer and the transistor.

According to some other embodiments of the disclosure, a repair method of an electronic device includes the following steps. A panel is provided. The panel includes a substrate, a first conductive layer disposed on the substrate, a dielectric layer disposed on the first conductive layer, a transistor disposed on the dielectric layer, and a reflection layer disposed between the first conductive layer and the transistor. The transistor includes a first electrode and a second electrode. At least one of the first electrode and the second electrode is cut with a laser beam. The reflection layer is used to reflect the laser beam.

In order for the features and advantages of the disclosure to be more comprehensible, the following specific embodiments are described in detail in conjunction with the drawings.

BRIEF DESCRIPTION OF THE DRAWINGS

The drawings are included to provide a further understanding of the disclosure, and the drawings are incorporated into the specification and constitute a part of the specification. The drawings illustrate embodiments of the disclosure and serve to explain principles of the disclosure together with the description.

DETAILED DESCRIPTION OF DISCLOSED EMBODIMENTS

Figure 1:
FIG. 1, FIG. 3, FIG. 6, and FIG. 8 are respectively partial top schematic views of an electronic device according to some embodiments of the disclosure.

Reference will now be made in detail to the exemplary embodiments of the disclosure, and examples of the exemplary embodiments are illustrated in the drawings. Wherever possible, the same reference numerals are used in the drawings and the description to refer to the same or similar parts.

Throughout the disclosure and the appended claims, certain terms may be used to refer to specific elements. It should be understood by persons skilled in the art that electronic device manufacturers may refer to the same element by different names. The disclosure does not intend to distinguish between elements with the same function but different names. In the following specification and claims, words such as "containing" and "comprising" are open-ended words, so the words should be interpreted as "including but not limited to . . . ".

Directional terms such as "upper", "lower", "front", "rear", "left", and "right" mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, the drawings should not be construed to define or limit the scope or nature covered by the embodiments. For example, the relative sizes, thicknesses, and positions of various layers, regions, and/or structures may be reduced or enlarged for clarity.

When a structure (or layer, element, base) is described in the disclosure as being located on/above another structure (or layer, element, base), it may mean that the two structures are adjacent and directly connected or it may mean that the two structures are adjacent but not directly connected. Indirect connection means that there is at least one intermediate structure (or intermediate layer, intermediate element, intermediate base, intermediate spacing) between the two structures. A lower surface of one structure is adjacent or directly connected to an upper surface of the intermediate structure, and an upper surface of the other structure is adjacent or directly connected to a lower surface of the intermediate structure. The intermediate structure may be composed of a single-layer or multi-layer physical structure or non-physical structure, which is not limited. In the disclosure, when a certain structure is disposed "on" another structure, it may mean that the certain structure is "directly" on another structure or it may mean that the certain structure is "indirectly" on another structure, that is, at least one structure is also sandwiched between the certain structure and another structure.

The terms "about", "equal to", "equivalent" or "same", "substantially", or "roughly" are generally interpreted as within 20% of a given value or interpreted as within 10%, 5%, 3%, 2%, 1%, or 0.5% of the given value. In addition, the terms "a range is from a first value to a second value" and "the range is between the first value to the second value" mean that the range includes the first value, the second value, and other values therebetween.

Terms such as "first" and "second" used in the description and the claims are used to modify elements and do not imply and represent that the element(s) have any previous ordinal numbers, nor do they represent the order of a certain element and another element or the order of a manufacturing method. The use of the ordinal numbers is only used to clearly distinguish between an element with a certain name and another element with the same name. The claims and the description may not use the same terms, whereby a first component in the specification may be a second component in the claims.

Electrical connection or coupling described in the disclosure may refer to direct connection or indirect connection. In the case of direct connection, terminals of elements on two circuits are directly connected or connected to each other by a conductor segment. In the case of indirect connection, there is a switch, a diode, a capacitor, an inductor, a resistor, other suitable elements, or a combination of the above elements between the terminals of the elements on the two circuits, but not limited thereto.

In the disclosure, the measurement manner of thickness, length, and width may be by adopting an optical microscope, and thickness or width may be measured by a cross-sectional image in an electron microscope, but not limited thereto. In addition, there may be a certain error in any two values or directions used for comparison. Furthermore, if a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

It should be noted that in the following embodiments, the features in several different embodiments may be replaced, recombined, and mixed to complete other embodiments without departing from the spirit of the disclosure. As long as the features of the embodiments do not violate the spirit of the invention or conflict with each other, the features may be arbitrarily mixed and matched for use.

Unless otherwise defined, all terms (including technical and scientific terms) used herein have the same meaning as commonly understood by persons skilled in the art to which the disclosure belongs. It is understood that the terms such as the terms defined in commonly used dictionaries should be interpreted as having meanings consistent with the relevant art and the background or context of the disclosure, and should not be interpreted in an idealized or overly formal manner, unless otherwise defined in the embodiments of the disclosure.

In the disclosure, although an electronic device is an antenna device as an example, the electronic device may also include a display device, a backlight device, a sensing device, or a splicing device, but not limited thereto. The electronic device may be a bendable or flexible electronic device. The display device may be a non-self-luminous display device or a self-luminous display device. The electronic device may, for example, include liquid crystal, a light emitting diode, fluorescence, phosphor, quantum dot (QD), other suitable display media, or a combination of the above. The antenna device may be a liquid crystal antenna device or a non-liquid crystal antenna device, and the sensing device may be a sensing device for sensing capacitance, light, thermal energy, or ultrasonic waves, but not limited thereto. In this disclosure, the electronic device may include an electronic unit. The electronic unit may include a passive element and an active element such as a capacitor, a resistor, an inductor, a diode, and a transistor. The diode may include a light emitting diode or a photodiode. The light emitting diode may include, for example, an organic light emitting diode (OLED), a mini LED, a micro LED, or a quantum dot LED, but not limited thereto. The splicing device may be, for example, a display splicing device or an antenna splicing device, but not limited thereto. It should be noted that the electronic device may be any permutation and combination of the above, but not limited thereto. In addition, the shape of the electronic device may be rectangular, circular, polygonal, a shape with curved edges, or other suitable shapes. The electronic device may have a peripheral system such as a driving system, a control system, and a light source system to support the display device, the antenna device, a wearable device (for example, including augmented reality or virtual reality), a vehicle-mounted device (for example, including a car windshield), or the splicing device.

Figure 10A:
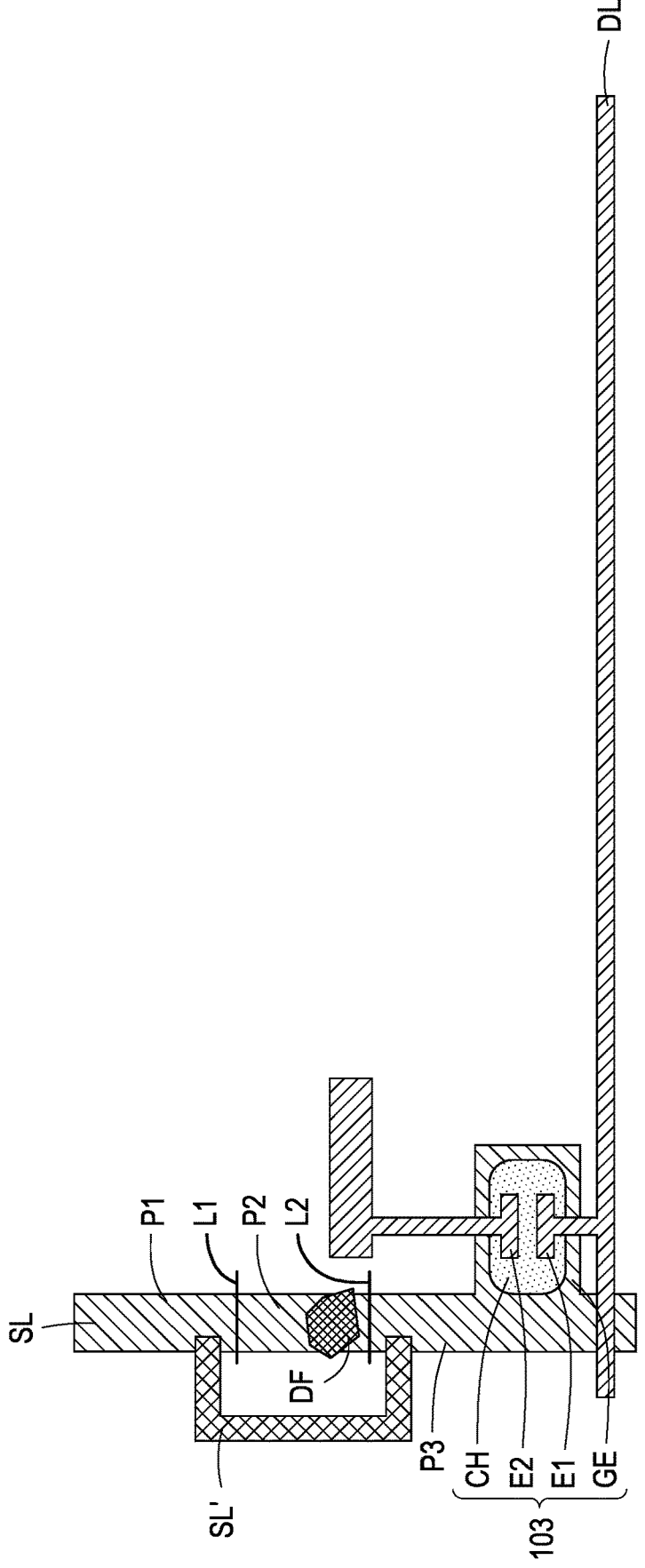
FIG. 10A and FIG. 10B are schematic flowcharts of a repair method of an electronic device according to some embodiments of the disclosure.
Figure 10B:
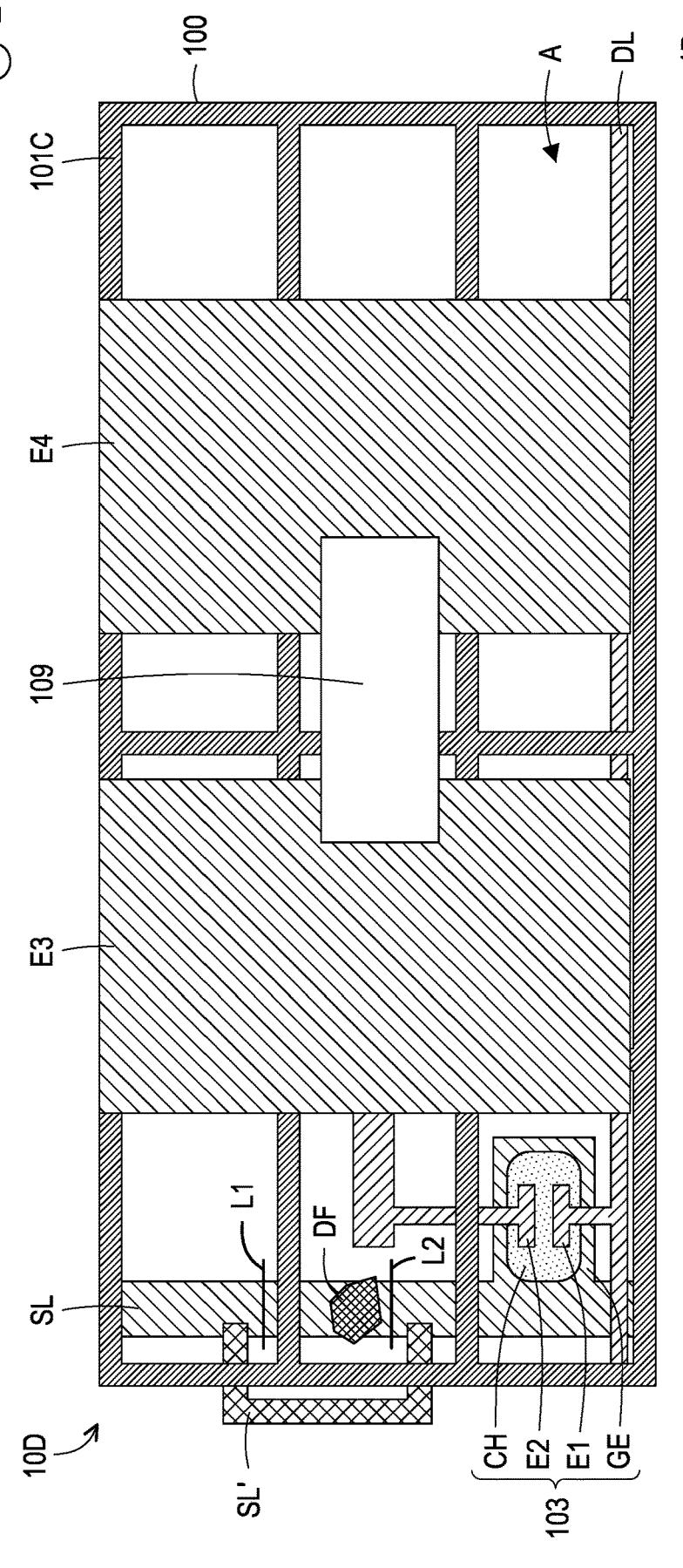
Figure 11A:
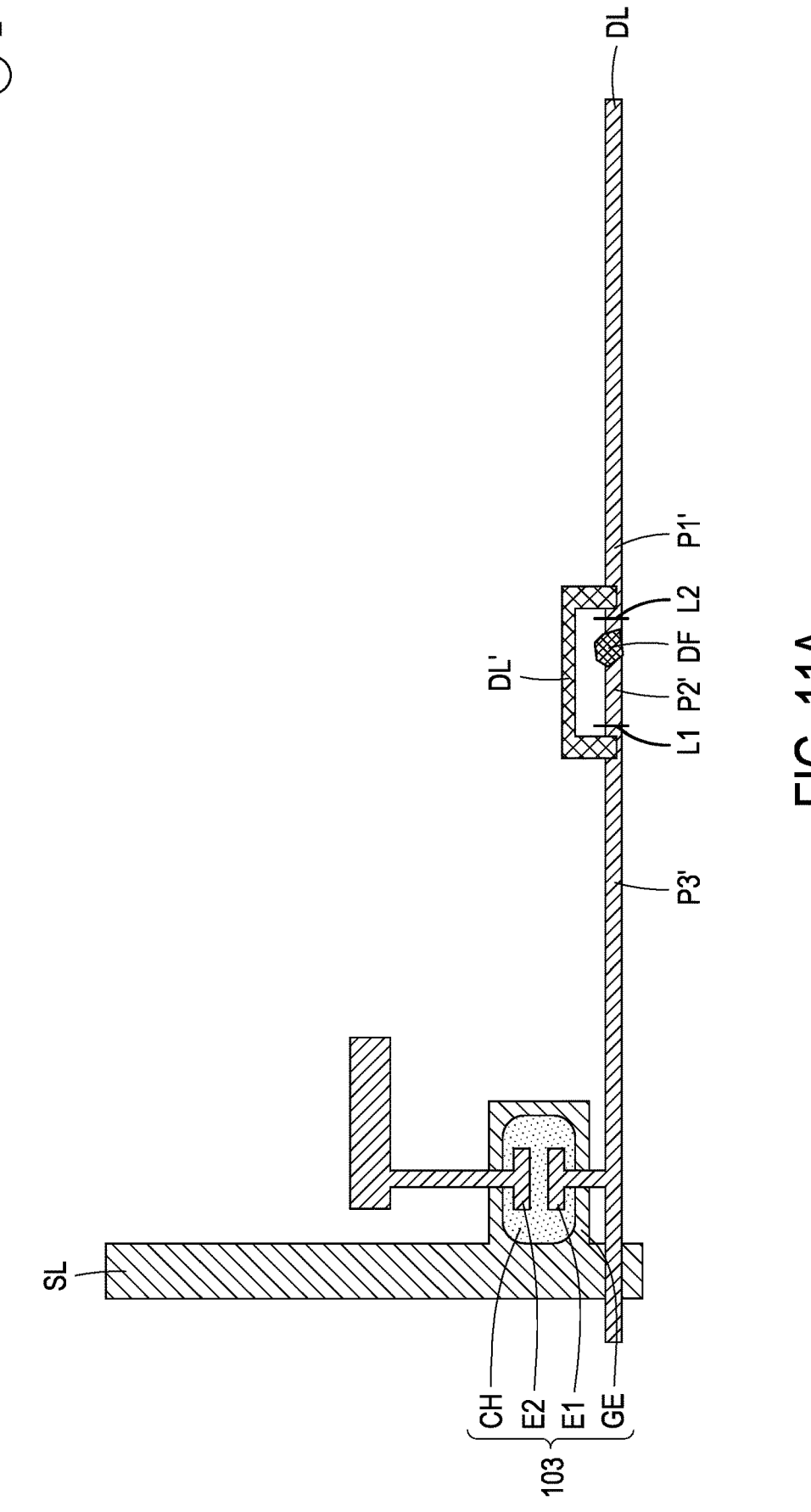
FIG. 11A and FIG. 11B are schematic flowcharts of a repair method of an electronic device according to other embodiments of the disclosure.
Figure 11B:
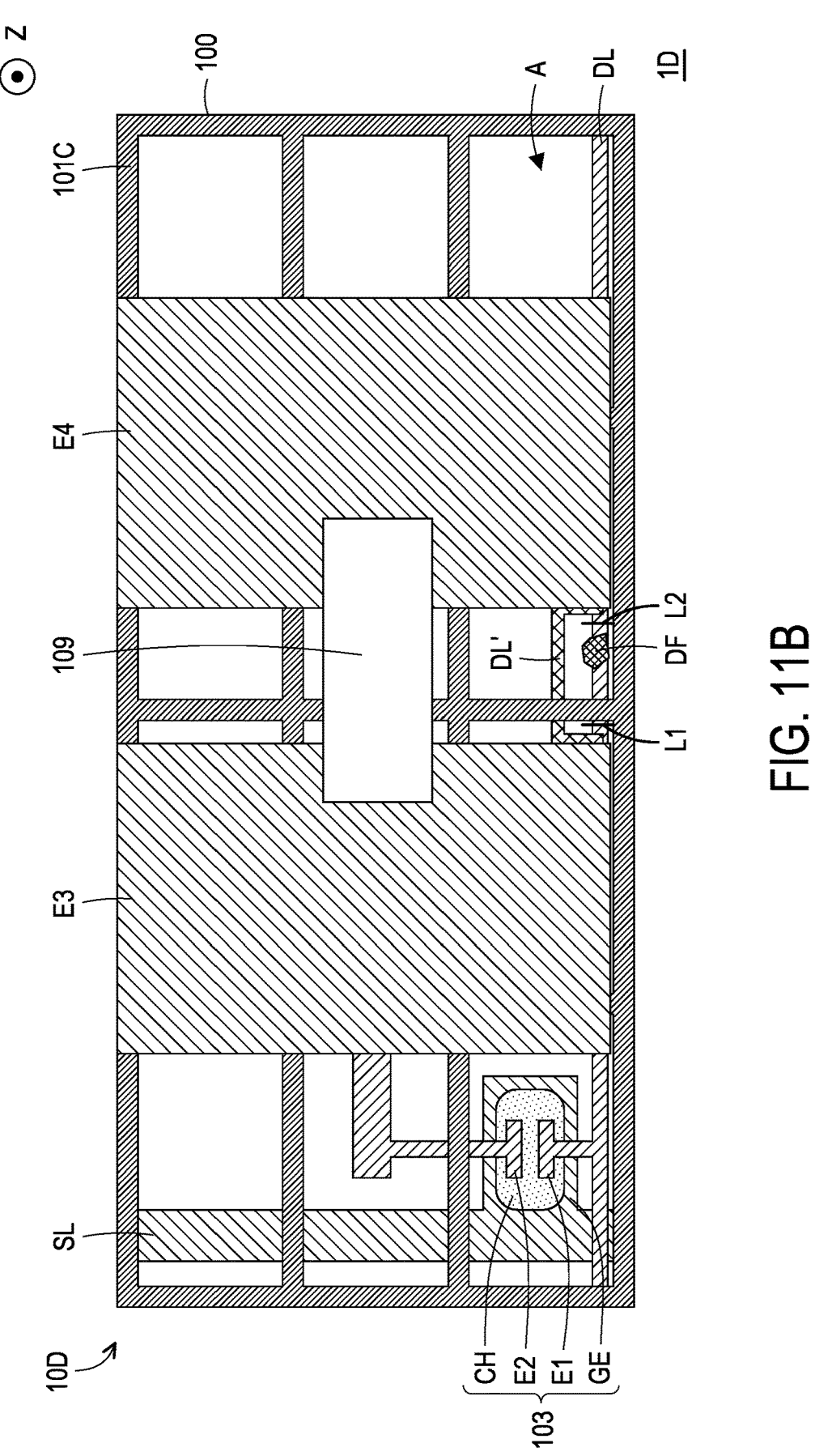

FIG. 1, FIG. 3, FIG. 6, and FIG. 8 are respectively partial top schematic views of an electronic device according to some embodiments of the disclosure. FIG. 2, FIG. 4, FIG. 5, FIG. 7, and FIG. 9 are respectively partial cross-sectional schematic views of an electronic device according to some embodiments of the disclosure. FIG. 10A and FIG. 10B are schematic flowcharts of a repair method of an electronic device according to some embodiments of the disclosure. FIG. 11A and FIG. 11B are schematic flowcharts of a repair method of an electronic device according to other embodiments of the disclosure.

In the top schematic views of FIG. 1, FIG. 3, FIG. 6, and FIG. 8, in order to clearly show the relative configuration relationship between some layers/elements, certain layers/elements in the electronic device are omitted. For the layers/elements not shown in the top schematic views, please refer to the corresponding cross-sectional schematic views (for example, FIG. 2, FIG. 4, FIG. 7, and FIG. 9).

Figure 2:
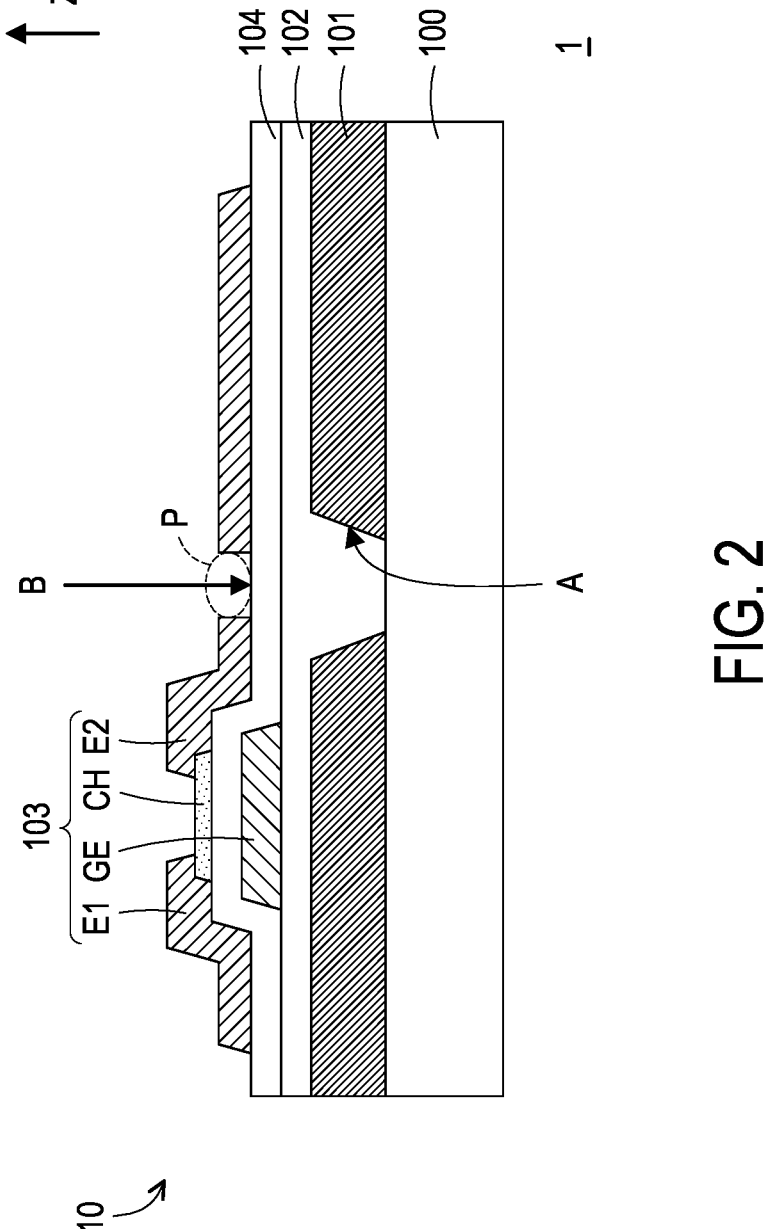
FIG. 2, FIG. 4, FIG. 5, FIG. 7, and FIG. 9 are respectively partial cross-sectional schematic views of an electronic device according to some embodiments of the disclosure.

Please refer to FIG. 1 and FIG. 2. An electronic device 1 may include a panel 10. The panel 10 may include a substrate 100, a first conductive layer 101, a dielectric layer 102, and a transistor 103. The first conductive layer 101 is disposed on the substrate 100 and has an opening A. The transistor 103 is disposed on the substrate 100, wherein the transistor 103 includes a first electrode E1 and a second electrode E2, and the transistor 103 at least partially overlaps with the opening A. The dielectric layer 102 is disposed between the first conductive layer 101 and the transistor 103.

Specifically, the substrate 100 may be a rigid substrate or a flexible substrate. The material of the substrate 100 includes, for example, glass, quartz, ceramics, sapphire, or plastic, but not limited thereto. The plastic may include polycarbonate (PC), polyimide (PI), polypropylene (PP), polyethylene terephthalate (PET), other suitable flexible material, or a combination of the above materials, but not limited thereto.

The first conductive layer 101 is disposed between the substrate 100 and the dielectric layer 102. The material of the first conductive layer 101 may include, for example, copper, aluminum, any conductive metal material, alloy, metal oxide, other conductive non-metallic materials, or a combination of the above, but not limited thereto.

The opening A of the first conductive layer 101 penetrates the first conductive layer 101 to expose the substrate 100 located below, that is, a region where the opening A is located is a region where at least a portion of the first conductive layer 101 is removed. The opening A is, for example, disposed corresponding to a laser repairing/cutting region. For example, as shown in FIG. 1, in the top view, the opening A may overlap with at least one of the first electrode E1 and the second electrode E2. In the disclosure, the term "overlapping" refers to at least partially overlapping in a direction (for example, a direction Z) perpendicular to a surface of the substrate 100 (for example, the surface of the substrate 100 facing the first conductive layer 101). In other words, the sentence "the opening A overlaps with at least one of the first electrode E1 and the second electrode E2" means that the projection area of the opening A at least partially overlaps with at least one of the first electrode E1 and the second electrode E2 in the direction Z. FIG. 1 schematically shows two openings A, and the two openings A respectively overlap with an end portion of the first electrode E1 away from the second electrode E2 and an end portion of the second electrode E2 away from the first electrode E1, but it should be understood that the number of the opening A and the relative configuration relationship between the opening A and other elements may be changed according to requirements and are not limited to what is shown in FIG. 1.

The dielectric layer 102 is, for example, disposed on the first conductive layer 101 and is filled into the opening A. The dielectric layer 102 may be a single layer or multiple layers. The material of the dielectric layer 102 includes, for example, an inorganic material such as silicon oxide, silicon nitride, or a combination of the above, but not limited thereto.

The transistor 103 is, for example, disposed on the dielectric layer 102. In addition to the first electrode E1 and the second electrode E2, the transistor 103 may also include a gate GE, and the gate GE overlaps with the first conductive layer 101. In some embodiments, as shown in FIG. 2, the gate GE may be between the first electrode E1 and the first conductive layer 101. In some other embodiments, as shown in FIG. 9, the first electrode E1 may be between the gate GE and a first conductive layer 101C.

The transistor 103 may also include a semiconductor pattern CH. The semiconductor pattern CH is disposed between the gate GE and the first electrode E1 and between the gate GE and the second electrode E2, and the semiconductor pattern CH overlaps with the gate GE. The material of the semiconductor pattern CH includes, for example, amorphous silicon, polysilicon, or metal oxide such as indium gallium zinc oxide (IGZO), but not limited thereto.

It should be understood that, FIG. 1 and FIG. 2 use a thin film transistor with a bottom gate as an exemplary transistor 103, but the type of the transistor 103 may be changed according to requirements and is not limited thereto.

According to different requirements, the panel 10 may also include other elements or layers. For example, the panel 10 may also include a dielectric layer 104. The dielectric layer 104 is disposed on the dielectric layer 102 and covers the gate GE. The dielectric layer 104 may be a single layer or multiple layers. The material of the dielectric layer 104 includes, for example, an inorganic material or an organic material such as silicon oxide and silicon nitride, or a combination of the above, but not limited thereto.

The panel 10 may also include a scan line SL and a data line DL. The scan line SL and the data line DL intersect with each other and may be electrically insulated from each other through the dielectric layer 104. The scan line SL is electrically connected to the gate GE. The scan line SL and the gate GE may belong to the same conductive layer (for example, referred to as a second conductive layer). The second conductive layer may be a single metal layer or a metal stack, and the material of the second conductive layer may include metal such as aluminum, a stack of molybdenum/aluminum/molybdenum, or a stack of titanium/aluminum/titanium, but not limited thereto.

One of the first electrode E1 and the second electrode E2 is a source, the other one of the first electrode E1 and the second electrode E2 is a drain, and the data line DL is electrically connected to the source. The data line DL, the first electrode E1, and the second electrode E2 may belong to the same conductive layer (for example, referred to as a third conductive layer). The third conductive layer may be a single metal layer or a metal stack of multiple layers such as a single aluminum layer, a metal stack of molybdenum/aluminum/molybdenum, and a metal stack of titanium/aluminum/titanium, but not limited thereto.

The repair method of the electronic device 1 may include providing the panel 10 (the detailed content about the panel 10 is aforementioned, and there will be no repetition); and cutting at least one of the first electrode E1 and the second electrode E2 with a laser beam B. A cutting point P formed by the laser beam B does not overlap with the first conductive layer 101.

For example, when a defect DF falls on the first electrode E1 and the second electrode E2 of the transistor 103, causing the first electrode E1 and the second electrode E2 to short circuit, at least one of the first electrode E1 and the second electrode E2 may be cut at the opening A through the laser beam B, so that the transistor 103 is disabled. Taking FIG. 1 as an example, the laser beam B may cut at least one of the first electrode E1 and the second electrode E2 along at least one of a path L1 and a path L2. When the first electrode E1 includes multiple branches, the path L1 crosses the branches of the first electrode E1, so when the laser beam B cuts the first electrode E1 along the path L1, the branches of the first electrode E1 are sequentially disconnected, and a cutting point P is formed at each of the branch of the first electrode E1 (to simplify FIG. 1, only the multiple cutting points P at the branches of the second electrode E2 are marked). Similarly, when the second electrode E2 includes multiple branches, the path L2 crosses the branches of the second electrode E2, so when the laser beam B cuts the second electrode E2 along the path L2, the branches of the second electrode E2 are sequentially disconnected, and a cutting point P is formed at each branch of the second electrode E2. It should be noted that in some embodiments, the laser beam B may only cut some branches of the first electrode E1 and/or the second electrode E2.

In the embodiment, the opening A of the first conductive layer 101 is designed to be disposed corresponding to the laser repairing/cutting region, that is, the range of the opening A covers at least the laser cutting path (for example, the path L1 and the path L2), and in the top view, the opening A overlaps with the cutting point P. When the laser beam B cuts the third conductive layer (for example, the first electrode E1 or the second electrode E2), since there is no first conductive layer 101 below the cutting point P of the third conductive layer, the possibility that short circuit of the upper and lower conductive layers (for example, the third conductive layer and the first conductive layer 101) happens due to high temperature melting during the laser repair process can be reduced. In some embodiments, the electronic device 1 may be an antenna device, and the panel 10 may be single high-frequency substrate for an antenna. The design of the opening A of the first conductive layer 101 can reduce short circuit during the laser repair process, while simplifying the circuit design of the first conductive layer 101 in the single high-frequency substrate or satisfying the return current (the current generated by the antenna device when receiving signals) at various frequencies.

In some embodiments, the opening A may be rectangular, but not limited thereto. Based on the consideration of the size of the light speckle of the laser beam B, a width WA of the opening A is, for example, greater than or equal to 5 micrometers (μm). On the other hand, based on the consideration of the size and the transmission of electromagnetic waves of the transistor 103, a length LA of the opening A may be designed to be less than or equal to a length LGE of the gate GE, and a maximum length ML (for example, the length of the diagonal line) of the opening A is, for example, less than one-fifth of the wavelength of the electromagnetic wave. Generally, the operation frequency of the antenna device for communication is 1 GHz to 1 THz. The product of the wavelength and the frequency of the electromagnetic wave for communication is equal to the speed of light, so after calculation, when the operation frequency is 1 GHz, the wavelength of the electromagnetic wave for communication may reach 300 meters (m), so the maximum length ML may be, for example, less than 60 m, and when the operation frequency is 1 THz, the maximum length ML is, for example, less than 60 μm. In some embodiments, the maximum length ML of the opening A may be less than or equal to 10 centimeters (cm) to match the actual size of the antenna device.

Figure 3:
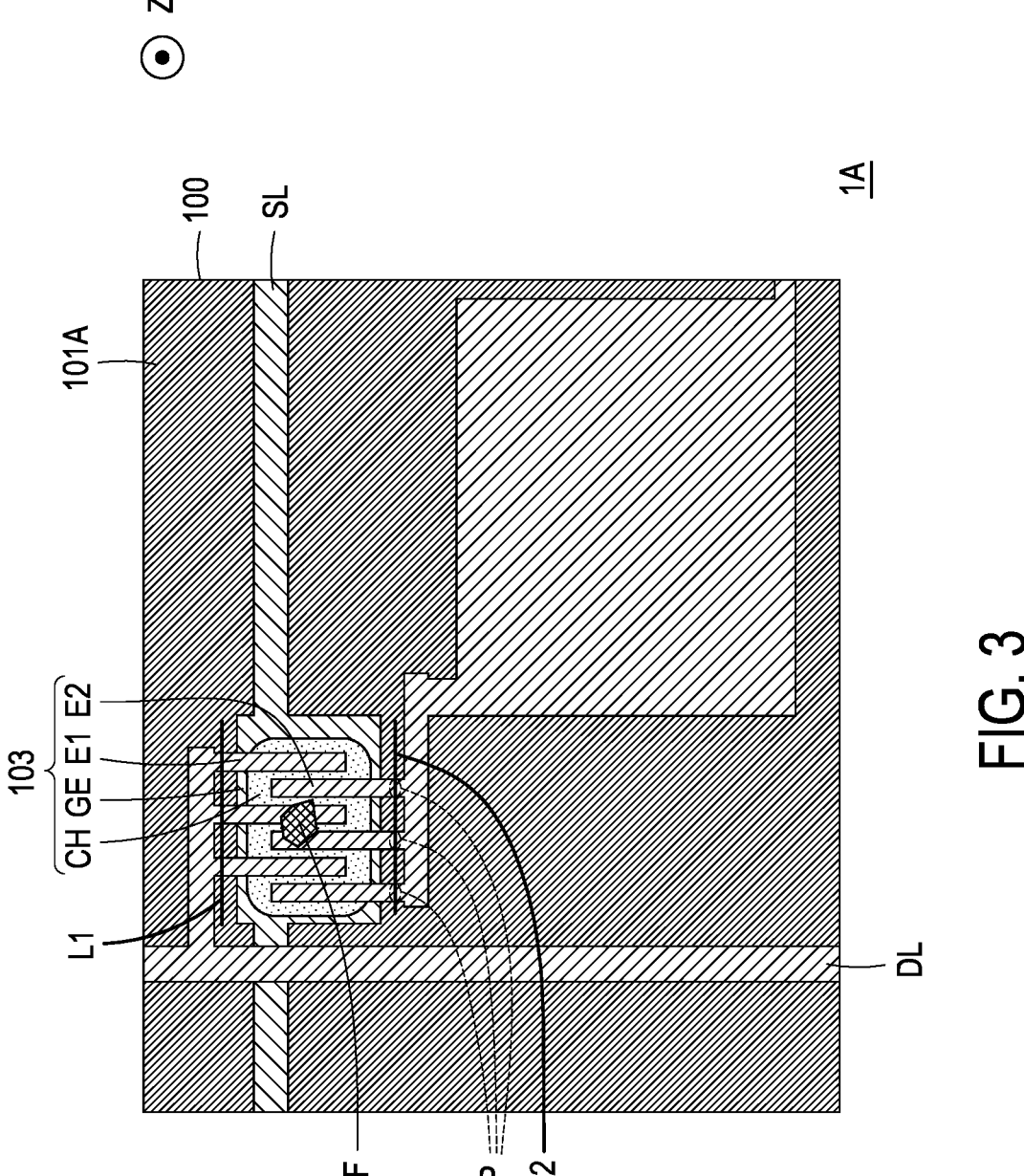
Figure 4:
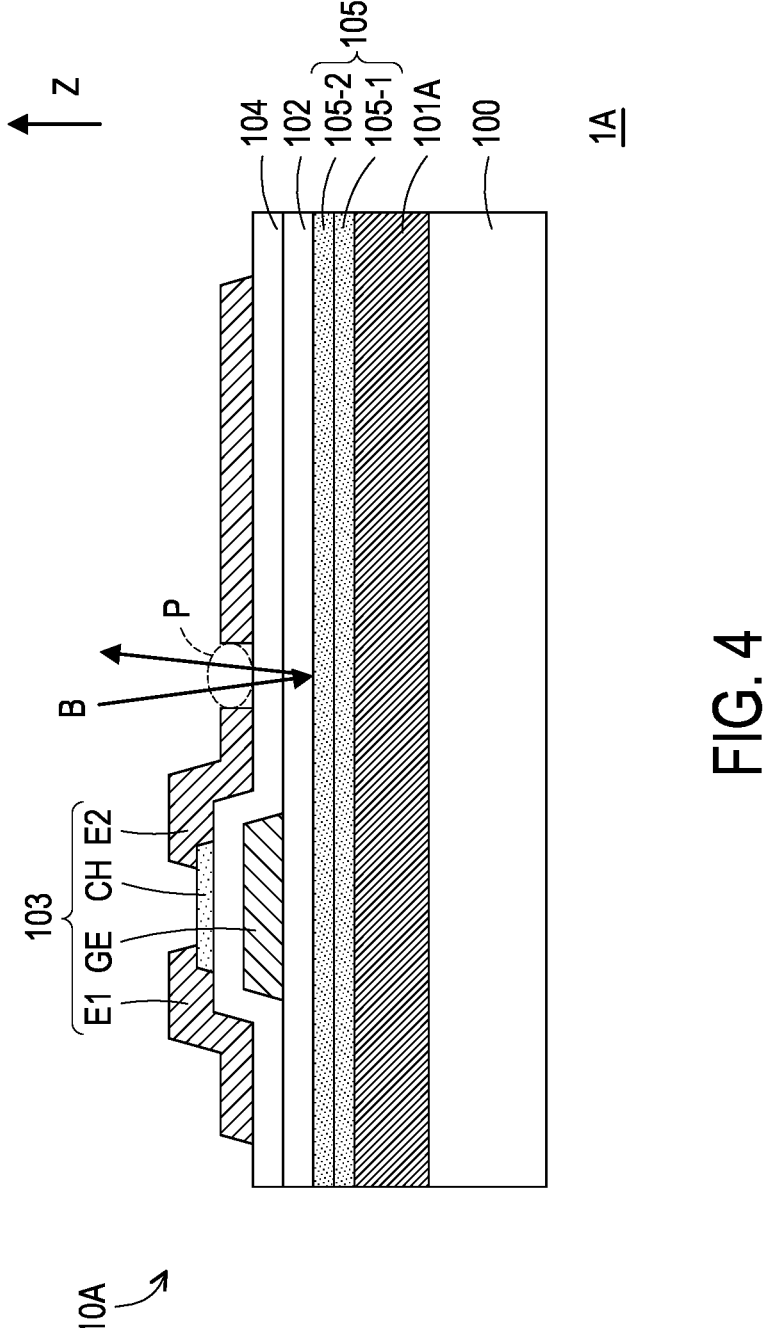

Please refer to FIG. 3 and FIG. 4. The main difference between an electronic device 1A and the electronic device 1 of FIG. 1 and FIG. 2 is described as follows. In the electronic device 1A, a panel 10A also includes a reflection layer 105 for reflecting the laser beam B. The reflection layer 105 is disposed between a first conductive layer 101A and the transistor 103 and is, for example, disposed between the first conductive layer 101A and the dielectric layer 102. In some embodiments, the material of the reflection layer 105 includes silicon nitride, but not limited thereto. In some embodiments, the reflection layer 105 includes multiple sub-layers (for example, a sub-layer 105-1 and a sub-layer 105-2, but not limited thereto), and the refractive indices of adjacent two of the sub-layers are different. Taking silicon nitride as the material of the sub-layers as an example, the refractive indices of different sub-layers may be controlled through changing the ratio of nitrogen to silicon in each sub-layer. In other words, for the sub-layers with different refractive indices formed with the above method, when using Fourier transform infrared spectroscopy (FTIR) to analyze the ratio of silicon-hydrogen bonds (Si—H) to nitrogen-hydrogen bonds (N—H) in the sub-layer 105-1 and the sub-layer 105-2, the ratio of Si—H to N—H in the sub-layer 105-1 is different from the ratio of Si—H to N—H in the sub-layer 105-2. In some embodiments, the thicknesses of the sub-layer 105-1 and the sub-layer 105-2 may be approximately a quarter of the wavelength of the laser beam B, for example, within the range of one-third to one-fifth of the wavelength (⅕ wavelength of laser beam≤thickness of sub-layer≤⅓ wavelength of laser beam), but not limited thereto.

Although FIG. 4 only schematically shows one sub-layer 105-1 and one sub-layer 105-2, it should be understood that the number of sub-layers with high and low refractive indices in the reflection layer 105 may be changed according to requirements, and the reflection layer 105 may be formed by alternately stacking one or more high refractive index sub-layers and one or more low refractive index sub-layers.

The repair method of the electronic device 1A may include providing the panel 10A (the detailed content about the panel 10A is aforementioned, and there will be no repetition); and cutting at least one of the first electrode E1 and the second electrode E2 with the laser beam B, wherein the reflection layer 105 is used to reflect the laser beam B.

For example, when the defect DF falls on the first electrode E1 and the second electrode E2 of the transistor 103, causing the first electrode E1 and the second electrode E2 to short circuit, at least one of the first electrode E1 and the second electrode E2 may be cut through the laser beam B, so that the transistor 103 is disabled. Taking FIG. 3 as an example, the laser beam B may cut at least one of the first electrode E1 and the second electrode E2 along at least one of the path L1 and the path L2. For example, when each of the first electrode E1 and/or the second electrode E2 includes multiple branches, the path L1 crosses the branches of the first electrode E1, so when the laser beam B cuts the first electrode E1 along the path L1, the branches of the first electrode E1 are sequentially disconnected, and a cutting point P is formed at each of the branch of the first electrode E1 (to simplify FIG. 3, only the cutting points P at the branches of the second electrode E2 are marked). The path L2 crosses the branches of the second electrode E2, so when the laser beam B cuts the branches of the second electrode E2 along the path L2, the branches of the second electrode E2 are sequentially disconnected, and a cutting point P is formed at each of the branch of the second electrode E2. It should be noted that in some embodiments, the laser beam B may only cut some branches of the first electrode E1 and/or the second electrode E2.

In the embodiment, the reflection layer 105 is disposed between the first conductive layer 101A and the third conductive layer (including the first electrode E1 and the second electrode E2), and the reflection layer 105 overlaps with the laser repairing/cutting region, for example, the reflection layer 105 may fully cover the substrate 100, but not limited thereto. When the laser beam B cuts the third conductive layer, since there is the reflection layer 105 below the cutting point P of the third conductive layer, the reflection layer 105 reflects the laser beam B, thereby reducing the possibility that short circuit of the first conductive layer 101A and the third conductive layer happens due to high temperature melting. Because of the reflection layer 105, the first conductive layer 101A does not need to form the opening A disposed corresponding to the laser repairing/cutting region.

Figure 5:
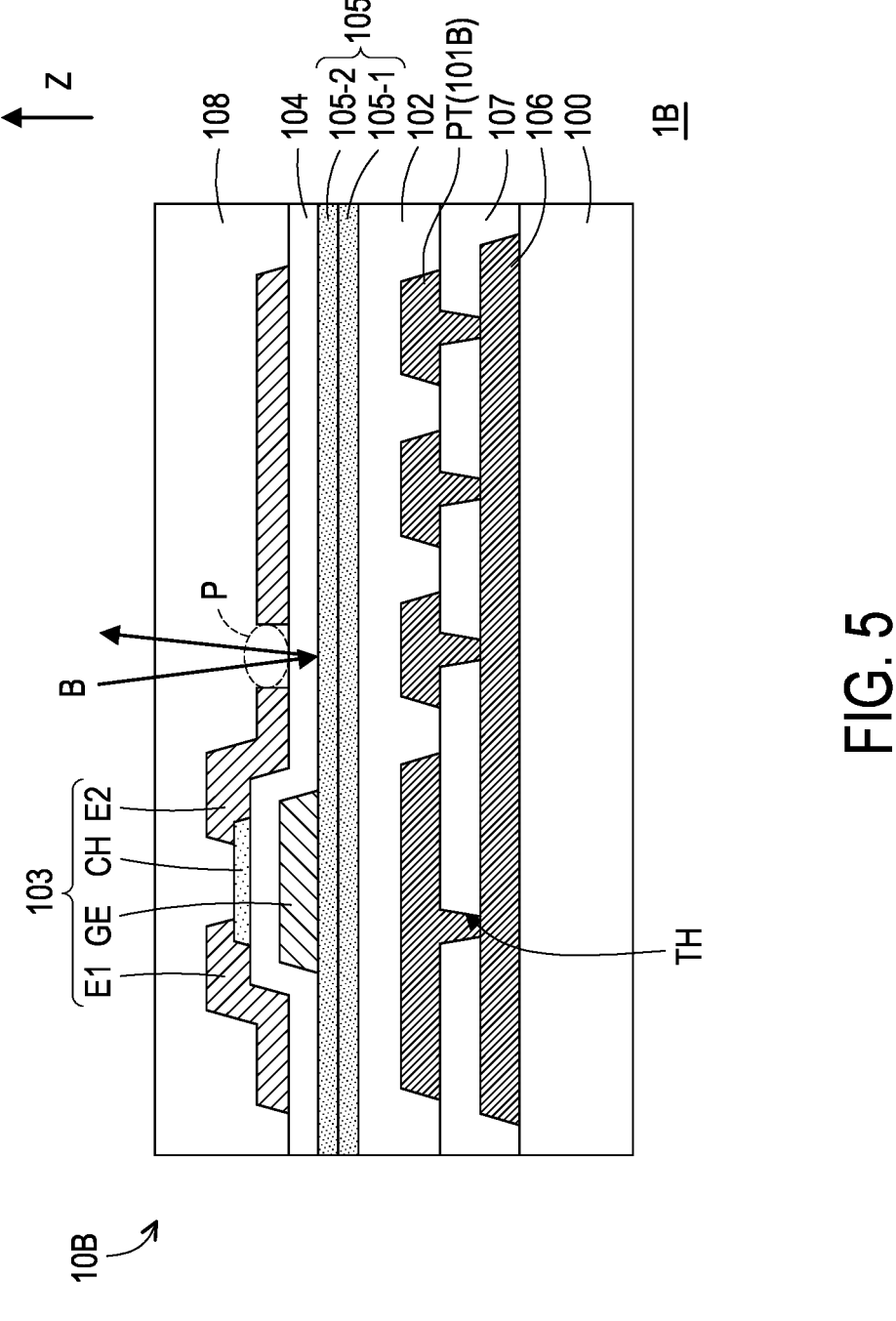

Please refer to FIG. 5. The main difference between an electronic device 1B and the electronic device 1A of FIG. 3 and FIG. 4 is described as follows. In the electronic device 1B, a panel 10B also includes a fourth conductive layer 106, a dielectric layer 107, and a dielectric layer 108.

The fourth conductive layer 106 is disposed on the substrate 100 and is located between the substrate 100 and the dielectric layer 107. For the material of the fourth conductive layer 106, reference may be made to the material of the first conductive layer 101, and there will be no repetition.

The dielectric layer 107 is disposed on the substrate 100 and the fourth conductive layer 106 and has multiple through holes TH. The through holes TH expose different regions of the fourth conductive layer 106. For the material of the dielectric layer 107, reference may be made to the material of the dielectric layer 102, and there will be no repetition.

The first conductive layer 101B is disposed on the dielectric layer 107 and is located between the dielectric layer 107 and the dielectric layer 102. The first conductive layer 101B is, for example, a patterned metal layer and includes multiple patterns PT. At least part of the patterns PT may be respectively electrically connected to the fourth conductive layer 106 through the through holes TH. The first conductive layer 101B may be a noise shielding structure, such as an electromagnetic bandgap (EBG) structure, wherein the patterns PT may periodically appear for controlling electromagnetic waves or reducing electromagnetic interference.

The dielectric layer 102 is disposed on the dielectric layer 107 and the first conductive layer 101B, and is located between the reflection layer 105 and the first conductive layer 101B. As shown in FIG. 5, the reflection layer 105 is disposed on the dielectric layer 102 and is located between the dielectric layer 104 and the dielectric layer 102. The second conductive layer (including the gate GE), the dielectric layer 104, a semiconductor layer (including a semiconductor pattern CH), the third conductive layer (including the first electrode E1 and the second electrode E2), and the dielectric layer 108 may be sequentially formed on the reflection layer 105, but not limited thereto. For example, in some embodiments, the gate GE may be located above the first electrode E1 and the second electrode E2. For the material of the dielectric layer 108, reference may be made to the material of the dielectric layer 102, and there will be no repetition.

Figure 6:
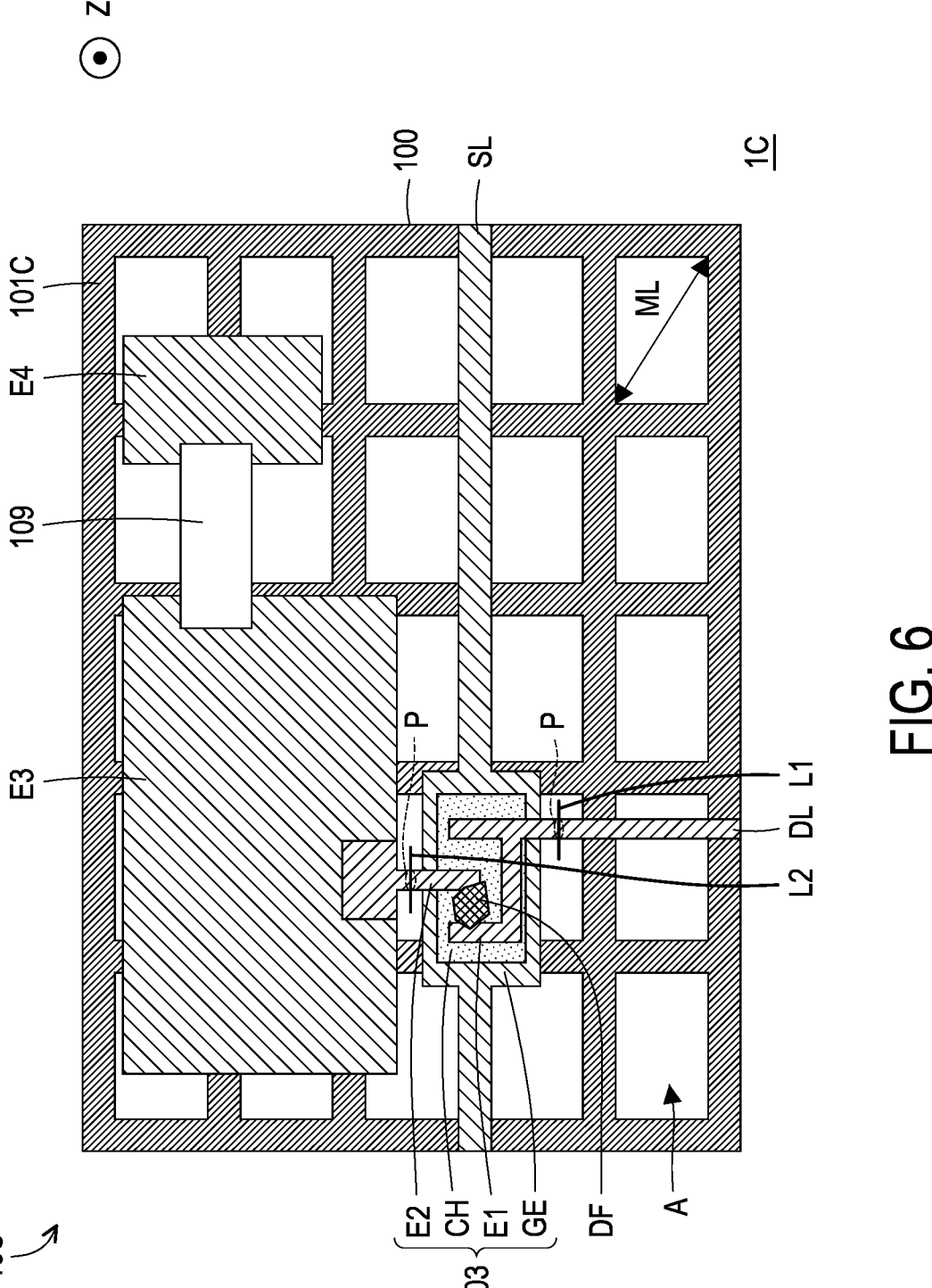
Figure 7:
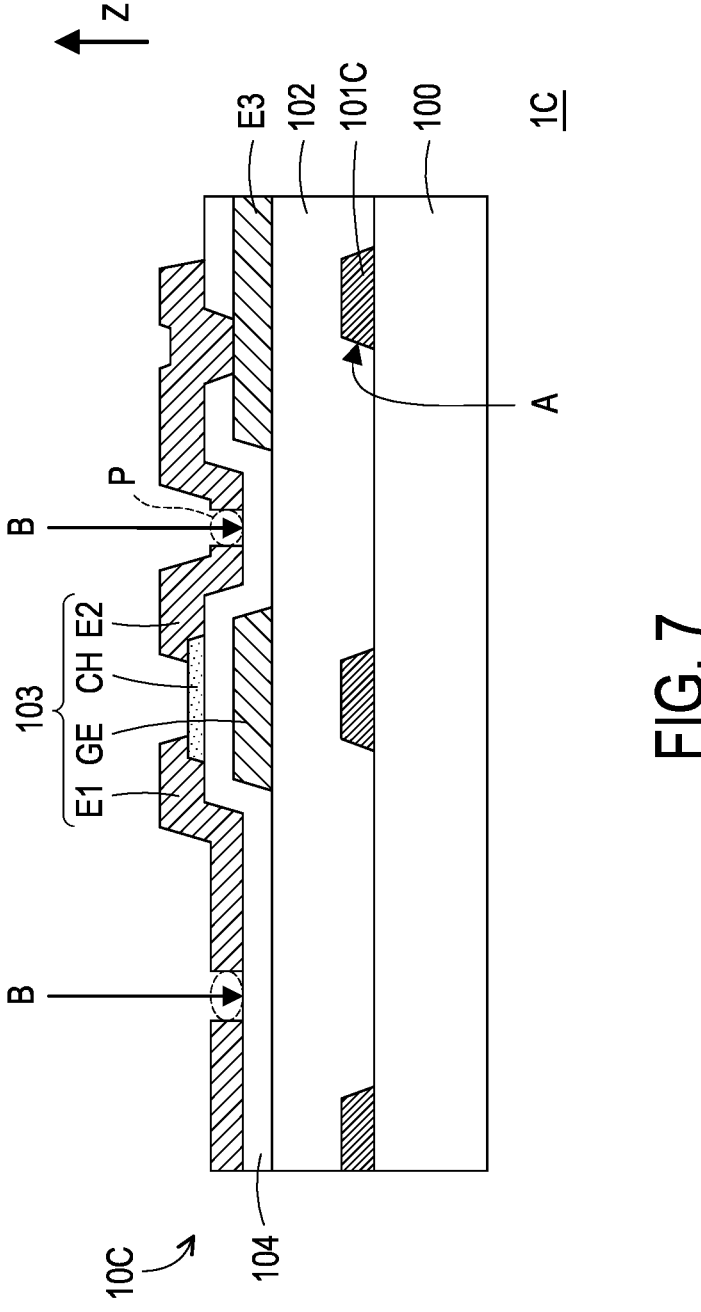

Please refer to FIG. 6 and FIG. 7. The main difference between an electronic device 1C and the electronic device 1 of FIG. 1 and FIG. 2 is described as follows. In the electronic device 1C, the first conductive layer 101C in a panel 10C is a grid electrode and has multiple openings A arranged in an array. The panel 10C also includes an electrode E3 and an electrode E4. The electrode E3 and the electrode E4 are both disposed on the dielectric layer 102, and the electrode E3 and the electrode E4 may, for example but not limited to, belong to the second conductive layer together with the scan line SL and the gate. The second electrode E2 may penetrate the dielectric layer 104 to be electrically connected to the electrode E3, and the electrode E4 may penetrate the dielectric layer 102 to be electrically connected to the first conductive layer 101C, but not limited thereto.

The panel 10C may also include one or more modulation elements 109 (only one is schematically shown in FIG. 6). The modulation element 109 is disposed on the substrate 100, and the modulation element 109 is used to modulate the phase or the amplitude of the electromagnetic wave for communication or the modulation element 109 simultaneously modulates the phase and the amplitude (not shown) of the electromagnetic wave for communication. The modulation element 109 is electrically connected to the transistor 103. More specifically, in the electronic device, the modulation elements 109 may be respectively electrically connected to different transistors 103, but the disclosure is not limited thereto. For example, two ends of the modulation element 109 may be respectively electrically connected to the electrode E3 and the electrode E4 through conductive members (not shown), and the modulation element 109 may be electrically connected to the second electrode E2 of the transistor 103 through the electrode E3, but not limited thereto. As mentioned above, when the antenna device is used for communication, based on the consideration of the transmission of electromagnetic waves, the length (for example, the maximum length ML) of the opening A is, for example, less than one-fifth of the wavelength of the electromagnetic wave for communication. The conductive member may include a conductive bump (for example, a solder ball) and a conductive glue such as an anisotropic conductive film (ACF), but not limited thereto. The modulation element 109 may be, for example, a variable capacitor, a variable inductor, a diode, or a combination of the above.

Figure 8:
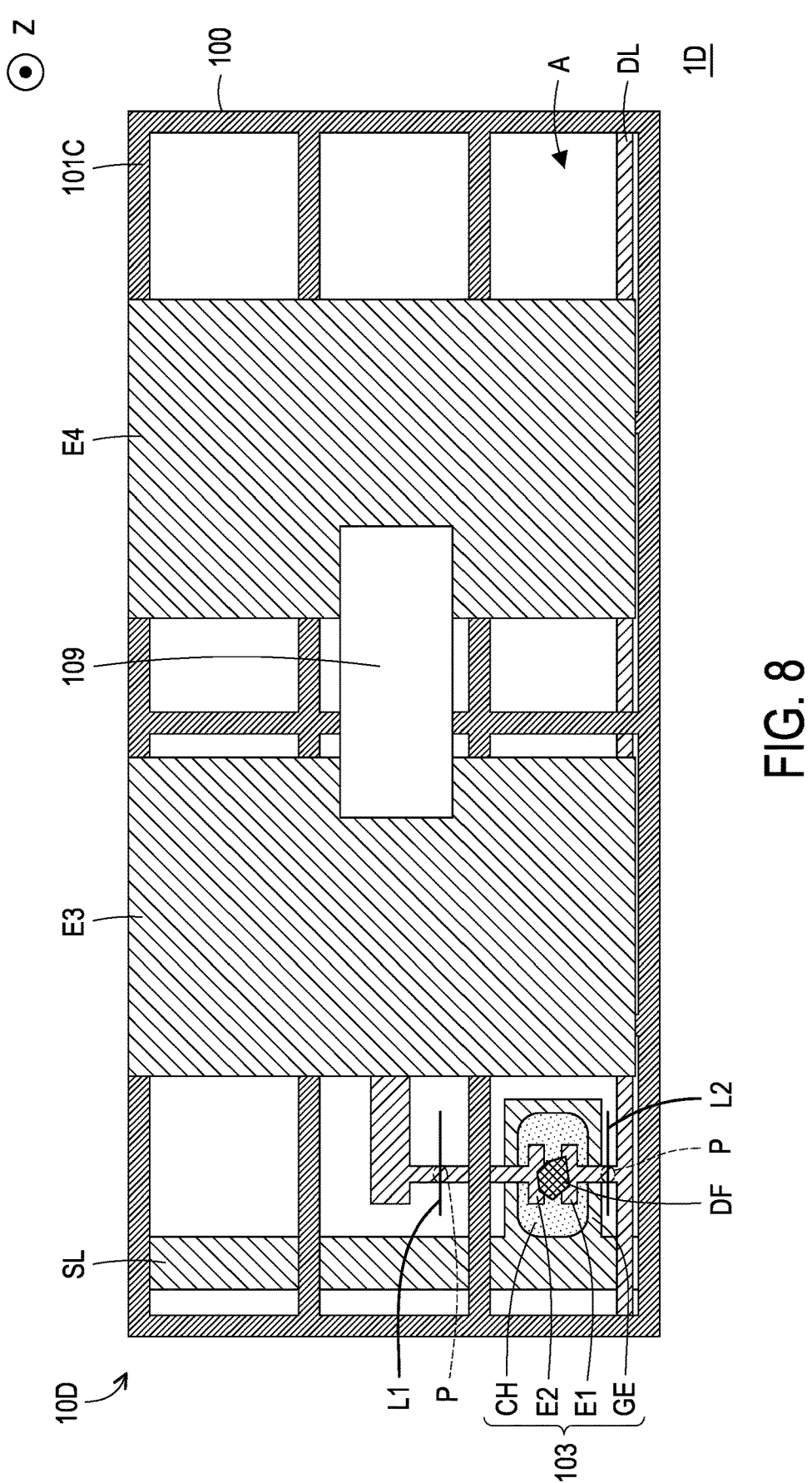
Figure 9:
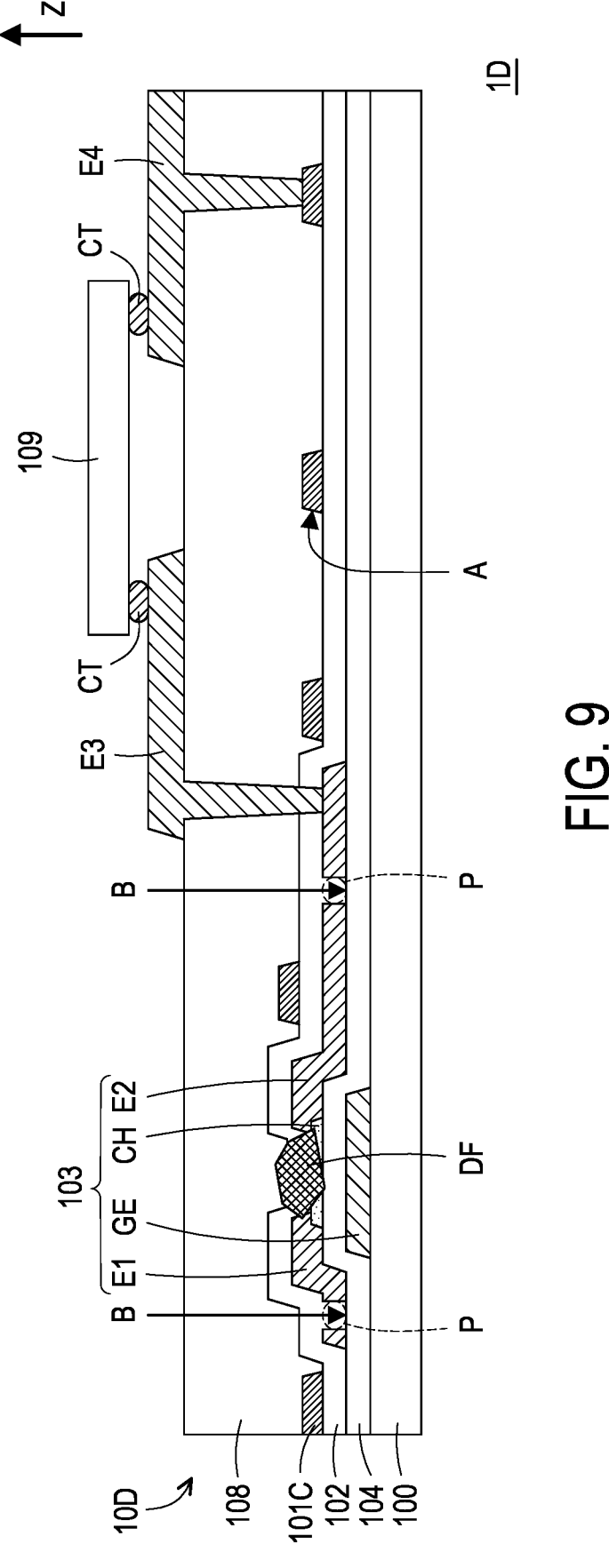

Please refer to FIG. 8 and FIG. 9. The main difference between an electronic device 1D and the electronic device 1C of FIG. 6 and FIG. 7 is described as follows. In the electronic device 1D, a panel 10D also includes a dielectric layer 108 and a conductive member CT, and the transistor 103, the dielectric layer 102, the first conductive layer 101C, and the dielectric layer 108 are sequentially formed on the substrate 100. In addition, the electrode E3 and the electrode E4 are disposed on the dielectric layer 108, wherein the electrode E3 penetrates the dielectric layer 108 and the dielectric layer 102 to be electrically connected to the second electrode E2, and the electrode E4 penetrates the dielectric layer 108 to be electrically connected to the first conductive layer 101C. In addition, the modulation element 109 is electrically connected to the electrode E3 and the electrode E4 through the conductive member CT.

In some embodiments, when the defect DF falls on the first electrode E1 and/or the second electrode E2 of the transistor 103, causing the first electrode E1 and the second electrode E2 to short circuit, laser repairing/cutting may be performed before forming the first conductive layer 101C, after forming the first conductive layer 101C and before bonding the modulation element 109, or after bonding the modulation element 109, so that the transistor 103 is disabled. For the detailed content of the path L1 and the path L2, the cutting point P, etc., please refer to the above, and there will be no repetition.

In some other embodiments, when the defect DF falls on the scan line SL, as shown in FIG. 10A and FIG. 10B, before forming the first conductive layer 101C, the scan line SL may be cut along the path L1 and the path L2 with a laser beam (not shown), wherein the path L1 and the path L2 are respectively located on two opposite sides of the defect DF. After the laser beam cuts the scan line SL along the path L1 and the path L2, the scan line SL is broken into three parts, including a first part P1, a second part P2, and a third part P3, wherein the third part P3 is connected to the gate GE, the second part P2 is located between the first part P1 and the third part P3, and the defect DF is located on the second part P2. Next, a wire SL' connecting the first part P1 and the third part P3 may be formed by means such as laser assisted chemical vapor deposition, so that the first part P1 is electrically connected to the third part P3. Afterwards, subsequent layers and elements (for example, the first conductive layer 101C, the electrode E3, the electrode E4, and the modulation element 109) may be successively formed to form the panel 10D.

Similarly, when the defect DF falls on the data line DL, as shown in FIG. 11A and FIG. 11B, before forming the first conductive layer 101C, the data line DL may be cut along the path L1 and the path L2 with a laser beam (not shown), wherein the path L1 and the path L2 are respectively located on two opposite sides of the defect DF. After the laser beam cuts the data line DL along the path L1 and the path L2, the data line DL is broken into three parts, including a first part P1', a second part P2', and a third part P3', wherein the third part P3' is connected to the first electrode E1, the second part P2' is located between the first part P1' and the third part P3', and the defect DF is located on the second part P2'. Next, a wire DL' connecting the first part P1' and the third part P3' may be formed by means such as laser assisted chemical vapor deposition, so that the first part P1' is electrically connected to the third part P3'. Afterwards, subsequent layers and elements (for example, the first conductive layer 101C, the electrode E3, the electrode E4, and the modulation element 109) may be successively formed to form the panel 10D.

Through performing laser cutting/repairing before forming the first conductive layer 101C, the possibility that short circuit of the upper and lower metal layers happens due to high temperature melting during the laser repair process can be reduced.

In summary, in the embodiments of the disclosure, short circuit caused by laser repairing can be reduced through forming the opening in the first conductive layer, forming the reflection layer between the first conductive layer and the transistor, or performing laser cutting/repairing before forming the first conductive layer.

The above embodiments are only used to illustrate, but not to limit, the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to deviate from the scope of the technical solutions of the embodiments of the disclosure.

Although the embodiments and the advantages of the disclosure have been disclosed above, it should be understood that any person skilled in the art may make changes, substitutions, and modifications without departing from the spirit and scope of the disclosure, and the features of the embodiments may be arbitrarily mixed and replaced to form other new embodiments. In addition, the protection scope of the disclosure is not limited to the process, machine, manufacture, material composition, device, method, and steps in the specific embodiments described in the specification. Any person skilled in the art may understand conventional or future-developed processes, machines, manufactures, material compositions, devices, methods, and steps from the content of the disclosure as long as the same may implement substantially the same functions or obtain substantially the same results as the embodiments described herein when used according to the disclosure. Therefore, the protection scope of the disclosure includes the above processes, machines, manufactures, material compositions, devices, methods, and steps. In addition, each claim constitutes a separate embodiment, and the protection scope of the disclosure further includes combinations of the claims and the embodiments. The protection scope of the disclosure should be defined by the appended claims.

What is claimed is:

1. An electronic device, comprising:
a panel, wherein the panel comprises:
a substrate;
a first conductive layer, disposed on the substrate and having an opening;
a transistor, disposed on the substrate, wherein the transistor comprises a first electrode and a second electrode, and the transistor at least partially overlaps with the opening;
a dielectric layer, disposed between the first conductive layer and the transistor; and
a modulation element, disposed on the substrate, wherein the modulation element is used to adjust an electromagnetic wave having a wavelength, the modulation element is electrically connected to the transistor, and a length of the opening is less than one-fifth of the wavelength.

2. The electronic device according to claim 1, wherein the opening overlaps with at least one of the first electrode and the second electrode.

3. The electronic device according to claim 1, wherein the transistor further comprises a gate, and the gate overlaps with the first conductive layer.

4. The electronic device according to claim 3, wherein the gate is between the first electrode and the first conductive layer.

5. The electronic device according to claim 3, wherein the first electrode is between the gate and the first conductive layer.

6. The electronic device according to claim 3, wherein a length of the opening is less than or equal to a length of the gate.

* * * * *